(12) United States Patent
Tanibuchi

(10) Patent No.: US 8,182,911 B2
(45) Date of Patent: May 22, 2012

(54) CUTTING TOOL, MANUFACTURING METHOD THEREOF AND CUTTING METHOD

(75) Inventor: Takahito Tanibuchi, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 896 days.

(21) Appl. No.: 12/294,886

(22) PCT Filed: Feb. 27, 2007

(86) PCT No.: PCT/JP2007/053691
§ 371 (c)(1),
(2), (4) Date: Sep. 26, 2008

(87) PCT Pub. No.: WO2007/122859
PCT Pub. Date: Nov. 1, 2007

(65) Prior Publication Data
US 2010/0166512 A1    Jul. 1, 2010

(30) Foreign Application Priority Data

Mar. 28, 2006 (JP) ................................. 2006-087807
Sep. 6, 2006 (JP) ................................. 2006-241016

(51) Int. Cl.
*B32B 9/00* (2006.01)

(52) U.S. Cl. ............ 428/325; 51/307; 51/309; 407/119; 407/255.23; 407/255.28; 407/255.39; 407/255.395; 407/299; 407/402; 407/419.1; 407/419.2; 407/419.7; 428/216; 428/336; 428/472; 428/698; 428/701; 428/702

(58) Field of Classification Search ............... 51/307, 51/309; 428/216, 325, 336, 472, 697, 698, 428/699, 701, 702; 407/119; 427/249.1, 427/249.13, 249.14, 249.17, 249.19, 250, 427/255.23, 255.28, 255.32, 255.39, 255.395, 427/299, 331, 402, 419.1, 419.2, 419.7
See application file for complete search history.

(56) References Cited

U.S. PATENT DOCUMENTS

| | | | |
|---|---|---|---|
| 4,822,689 A * | 4/1989 | Fukubayashi et al. | 428/472 |
| 5,652,045 A | 7/1997 | Nakamura et al. | 407/119 |
| 7,172,807 B2 * | 2/2007 | Fukano et al. | 428/216 |
| 7,396,371 B2 * | 7/2008 | Cedergren et al. | 51/307 |

FOREIGN PATENT DOCUMENTS

| | | |
|---|---|---|
| EP | 0 709 484 A1 | 5/1996 |
| JP | 61-270374 A | 11/1986 |
| JP | 04-082604 A | 3/1992 |
| JP | 05-140763 A | 6/1993 |
| JP | 06-136505 * | 5/1994 |
| JP | 07-243023 A | 9/1995 |
| JP | 08-118105 A | 5/1996 |
| JP | 8-118105 A | 5/1996 |
| JP | 10-310877 A | 11/1998 |

(Continued)

*Primary Examiner* — Archene Turner
(74) *Attorney, Agent, or Firm* — DLA Piper LLP (US)

(57) ABSTRACT

Disclosed is a cutting tool having excellent wear resistance. Specifically disclosed is a cutting tool having a substrate and a coating layer formed on a surface of the substrate. The cutting tool is characterized in that the substrate contains at least cobalt; the coating layer includes at least a titanium nitride layer formed on the surface of the substrate, a titanium carbonitride layer formed on the surface of the titanium nitride layer, an intermediate layer formed on the surface of the titanium carbonitride layer and an aluminum oxide layer formed on the surface of the intermediate layer; the intermediate layer contains at least oxygen and titanium, and the aluminum oxide layer incorporates particles composed mainly of cobalt.

15 Claims, 5 Drawing Sheets

FOREIGN PATENT DOCUMENTS

| | | |
|---|---|---|
| JP | 11-229143 A | 8/1999 |
| JP | 11-229144 A | 8/1999 |
| JP | 2000-158207 A | 6/2000 |
| JP | 2004-249380 A | 9/2004 |
| JP | 2005-279822 A | 10/2005 |
| JP | 2006-021316 A | 1/2006 |

* cited by examiner (a)

(b)

CUTTING TOOL, MANUFACTURING METHOD THEREOF AND CUTTING METHOD

CROSS-REFERENCE TO RELATED APPLICATIONS

This application is a national stage of International Application No. PCT/JP2007/053691, filed on Feb. 27, 2007, and claims the benefit of priority under 35 USC 119 of Japanese Patent Application No. 2006-087807, filed on Mar. 28, 2006, and Japanese Patent Application No. 2006-241016, filed on Sep. 6, 2006, the contents of which are incorporated herein by reference.

TECHNICAL FIELD

The present invention relates to a cutting tool used in cutting of materials such as metals, a method of manufacturing the cutting tool and a cutting method.

BACKGROUND ART

Cutting inserts having a coating layer deposited on a substrate surface have conventionally been used for different types of purposes. For example, in the cutting tools widely used in cutting of metals, a single or multilayer of coating layers such as a titanium carbide layer (TiC), a titanium nitride (TiN) layer, a titanium carbonitride layer (TiCN), an aluminum oxide ($Al_2O_3$) layer and a titanium aluminum nitride (TiAlN) layer are deposited on a surface of a hard substrate composed of cemented carbide, cermet, ceramics or the like. The recent diversification of cutting of materials requires further improvements in fracture resistance and wear resistance.

In order to improve the properties of these coating layers, Patent Document 1 discloses a surface coated tungsten carbide based cutting tool, which is described as exhibiting excellent wear resistance. The cutting tool has, on a surface of a tungsten carbide based cemented carbide substrate, a coating layer constructed from a granular titanium nitride (TiN) layer having a granular crystal structure and an average layer thickness of 0.1 to 1 μm, a titanium carbonitride (TiCN) layer having columnar crystal structure and an average layer thickness of 2 to 15 μm, an aluminum oxide layer ($Al_2O_3$) layer having an average layer thickness of 0.5 to 10 μm, and a titanium carbide (TiC) layer having columnar crystal structure and an average layer thickness of 2 to 10 μm.

Patent Document 2 discloses a surface coated tungsten carbide based cemented carbide end mill having a coating layer on a surface of a tungsten carbide based cemented carbide substrate. The coating layer is constructed from a titanium nitride (TiN) layer having a granular crystal structure and an average layer thickness of 0.1 to 1 μm, and a titanium carbonitride (TiCN) layer having an elongated growth crystal structure and an average layer thickness of 0.3 to 3 μm, and further having, on a face and a flank other than a cutting edge, a titanium oxycarbonitride (TiCNO) layer having a granular crystal structure and an average layer thickness of 0.1 to 1 μm, and an aluminum oxide ($Al_2O_3$) layer having a granular crystal structure and an average layer thickness of 0.1 to 1.5 μm. That is, the $Al_2O_3$ layer on the cutting edge is removed to expose the TiCN layer.

Patent Documents 3 and 4 disclose the methods of improving the adhesiveness between the substrate and the coating layer by diffusing the component constituting the substrate into the coating layer.

Specifically, there are disclosed cutting tools obtained by sequentially coating with CVD (chemical vapor deposition) method, on a surface of a substrate composed of tungsten carbide (WC) based cemented carbide containing cobalt (Co), a first layer of titanium carbide (TiC) or titanium nitride (TiN), a second layer of titanium carbonitride (TiCN) containing columnar crystals, a third layer of titanium carbide (TiC), titanium oxycarbide (TiCO) or the like, and a fourth layer of aluminum oxide ($Al_2O_3$) layer, and then diffusing tungsten (W) and cobalt (Co) existing in the substrate into the first and second layers or the first to third layers.

Patent Document 1: Japanese Unexamined Patent Publication No. 2000-158207
Patent Document 2: Japanese Unexamined Patent Publication No. 11-229143
Patent Document 3: Japanese Unexamined Patent Publication No. 7-243023
Patent Document 4: Japanese Unexamined Patent Publication No. 8-118105

DISCLOSURE OF THE INVENTION

Problems to be Solved by the Invention

However, the configurations of the coating layers described in the above-mentioned Patent Document 1 and Patent Document 2 had failed to obtain sufficient wear resistance. Therefore, their respective wear resistance is still insufficient for use in cutting hard-to-cut materials such as stainless steel, necessitating further improvement of wear resistance.

Stainless steel has a low thermal conductivity, facilitating to increase the cutting temperature. Therefore, the cutting temperature is liable to rise by the cutting of materials, and the work material is built up on the cutting edge, thus being susceptible to diffusion wear.

When the method described in the above-mentioned Patent Document 3 or 4, the elements diffused from the substrate exist as impurities, causing adhesive strength reduction of the coating layer. This makes it difficult to obtain sufficient fracture resistance, failing to maintain cutting performance over a long period of time.

Accordingly, it is desirable to provide a cutting tool having excellent wear resistance.

Means for Solving the Problems

According to one embodiment of the invention, there is provided a cutting tool having a substrate and a coating layer deposited on a surface of the substrate. The substrate contains at least cobalt. The coating layer includes at least a titanium nitride layer deposited on the surface of the substrate, a titanium carbonitride layer deposited on the surface of the titanium nitride layer, an intermediate layer deposited on the surface of the titanium carbonitride layer and an aluminum oxide layer deposited on the surface of the intermediate layer. The intermediate layer contains at least oxygen and titanium. The aluminum oxide layer incorporates particles composed mainly of cobalt.

According to other embodiment of the invention, there is provided a cutting tool having a substrate and a coating layer deposited on a surface of the substrate. The coating layer includes at least a titanium nitride layer deposited on the surface of the substrate, a titanium carbonitride layer deposited on the surface of the titanium nitride layer, an intermediate layer deposited on the surface of the titanium carbonitride layer and an aluminum oxide layer deposited on the surface of the intermediate layer. Toward the aluminum oxide layer from the intermediate layer, protruding particles composed of at least one selected from the group consisting of titanium oxycarbide, titanium oxynitride, titanium carboxynitride and titanium oxide are dotted in an average crystal height of 0.05 to 0.4 μm. The protruding particles merge into the aluminum oxide layer.

According to still other embodiment of the invention, there is provided a method of manufacturing a cutting tool having a substrate and a coating layer deposited on a surface of the substrate. The coating layer includes at least a titanium nitride layer deposited on the surface of the substrate, a titanium carbonitride layer deposited on the surface of the titanium nitride layer, an intermediate layer deposited on the surface of the titanium carbonitride layer and an aluminum oxide layer deposited on the surface of the intermediate layer. The method includes: (i) the preprocessing step of retaining the substrate in a CVD furnace by introducing into the CVD furnace a mixed gas prepared by mixing $H_2$ in the range of 50 to 75 vol % and $N_2$ in the range of 25 to 50 vol %, totaling 100 vol %, while performing control so that a Vg/Vr is 0.1 to 0.3, where Vg is the volume (flow rate) of the introduced gas at normal temperature and normal pressure, and Vr is the volume of the inside of the CVD furnace; (ii) the titanium nitride layer forming step of depositing a titanium nitride layer on a surface of the substrate; (iii) the mid-processing step of retaining the substrate provided with the titanium nitride layer in the CVD furnace by introducing a mixed gas prepared by mixing $H_2$ in the range of 50 to 75 vol % and $N_2$ in the range of 25 to 50 vol %, totaling 100 vol %, while performing control so that the Vg/Vr is 0.1 to 0.3; (iv) the titanium carbonitride layer/intermediate layer forming step of sequentially depositing a titanium carbonitride layer and an intermediate layer on the titanium nitride layer; (v) the post-processing step of retaining the substrate provided with the intermediate layer by introducing a mixed gas prepared by mixing $AlCl_3$ in the range of 1 to 15 vol % and $H_2$ in the range of 85 to 99 vol %, totaling 100 vol %; and (vi) the aluminum oxide layer forming step of depositing an aluminum oxide layer on the intermediate layer.

Effects of the Invention

The use of the present invention enables to suppress cracks generated in the coating layer during heavy interrupted cutting. In the case that the surface layer is provided on the aluminum oxide layer, the aluminum oxide layer enables to suppress propagation of cracks generated in the surface layer.

PREFERRED EMBODIMENTS FOR CARRYING OUT THE INVENTION

The present invention relates to cutting tools for use in cutting of materials such as metals. More particularly, the invention relates to cutting tools using, as a hard phase, a hard material having a coating layer deposited on a substrate composed of cemented carbide binding at least cobalt with a binding metal.

The term "cutting tools" denotes cutting inserts used in brazing type or throw-away type turning tool bits, and those having a cutting edge portion contributing to cutting, such as solid type drills or end mills. In the following preferred embodiments, a cutting insert mounted on a holder as a cutting tool will be exemplified and described.

FIG. 1(a) shows a schematic perspective view in a preferred embodiment of the cutting insert of the invention. FIG. 1(b) shows a schematic sectional view including a cutting edge.

The cutting insert in FIG. 1 has a flat plate shape, whose upper surface is used as a face 3, lower surface is used as a seat 4 and a side surface is used as a flank 5. A cutting edge 6 extends along the crossed ridge portion between the face 3 and the flank 5. A coating layer 8 is coated by deposition on the surface of a substrate 2 composed of cemented carbide.

The substrate 2 is composed of cemented carbide whose hard phase is bound by a binding phase. The hard phase contains at least one selected from carbides, nitrides and carbonitrides of groups 4, 5 and 6 metals of the periodic table. Specific examples thereof include those composed mainly of tungsten carbide (WC) and containing, if desired, at least one selected from carbides (other than tungsten carbide), nitrides and carbonitrides.

The binding phase is composed of a binding metal. Examples of the binding metal include those containing at least cobalt (Co). Alternatively, other metal may also be contained therein, and iron (Fe), nickel (Ni), molybdenum (Mo), chromium (Cr) can be used, for example.

The coating layer has (a) a titanium nitride (TiN) layer 10, (b) a titanium carbonitride (TiCN) layer 11, (c) an intermediate layer 12, and (d) an aluminum oxide ($Al_2O_3$) layer 14, which are sequentially deposited from bottom to top in this order on the substrate.

The intermediate layer 12 is composed of at least one selected from the group consisting of titanium oxycarbide (TiCO), titanium oxynitride (TiNO), titanium oxycarbonitride (TiCNO) and titanium oxide ($Ti_2O_3$, $TiO_2$).

Alternatively, (e) a surface layer 15 may be further deposited on the aluminum oxide ($Al_2O_3$) layer 14. The surface layer 15 is composed of at least one selected from the group consisting of titanium nitride (TiN), zirconium nitride (ZrN) and hafnium nitride (HfN).

In the coating layer 8, the average film thickness of the entirety containing all the above-mentioned layers is preferably 1.5 to 7.0 μm, particularly 2 to 5 μm.

As a characteristic feature of the invention, particles E composed mainly of cobalt (Co) (hereinafter referred to as cobalt particles) are incorporated into the aluminum oxide ($Al_2O_3$) layer, as shown in FIG. 2. These cobalt particles E correspond to those that can be observed as being deposited as particles in the aluminum oxide ($Al_2O_3$) layer, not in the state of solid-dissolved in the aluminum oxide ($Al_2O_3$) layer. Specifically, the cobalt particles E are those that can be confirmed through observation of the cut face thereof or the fracture face thereof by a scanning electron microscope (SEM) at magnifications of ×5000 to ×20000.

Thus, both high hardness and high toughness are attainable owing to the coexistence of the cobalt (Co) particles E having excellent ductility and the aluminum oxide ($Al_2O_3$) particles having excellent hardness in the aluminum oxide ($Al_2O_3$) layer 14. This enables suppression of the occurrence of cracks in the aluminum oxide ($Al_2O_3$) layer 14 when a strong shock is generated during heavy interrupted cutting.

In other words, in the configuration that no cobalt (Co) particles E exists in the aluminum oxide ($Al_2O_3$) layer 14, cracks are liable to occur in the aluminum oxide ($Al_2O_3$) layer 14, so that the cutting edge is susceptible to fractures originated from the cracks.

On the other hand, when the surface layer 15 is deposited on the aluminum oxide ($Al_2O_3$) layer 14, even if cracks occur in the surface layer 15, the aluminum oxide ($Al_2O_3$) layer 14 incorporating the cobalt particles E having high toughness can suppress the occurrence of cracks.

When the aluminum oxide ($Al_2O_3$) layer 14 incorporates a plurality of cobalt (Co) particles E, the average particle size thereof is 0.05 to 0.4 preferably 0.1 to 0.3 μm, and more preferably 0.1 to 0.2 μm.

In the above-mentioned range, the cutting tool has a good balance between the toughness of metal and the wear resistance of ceramics. The aluminum oxide ($Al_2O_3$) layer 14 has high toughness, that is, accomplishes the function of cushion. This enables suppression of the occurrence of cracks. Thus, the above-mentioned range is suitable for improving the adhesive strength of the coating layer 8 without lowering wear resistance.

The cobalt (Co) particles E in the aluminum oxide ($Al_2O_3$) layer 14 are preferably composed of 92 to 98 wt % of cobalt (Co), 1.0 to 4.0 wt % of titanium (Ti) and the remainder as unavoidable impurities, totaling 100 wt %.

In the above-mentioned range, both excellent wear resistance and toughness are attainable owing to a good balance between titanium (Ti) superior to cobalt (Co) in terms of ductility, and cobalt (Co) superior to titanium in terms of elastic modulus.

In the present invention, the average particle size of cobalt (Co) particles is obtained by taking the scanning electron microscopic (SEM) photographs of five locations on an arbitrary fracture surface including the aluminum oxide ($Al_2O_3$) layer 14 constituting the coating layer 8, and measuring the dimension of cobalt (Co) particles E dotted in the aluminum oxide ($Al_2O_3$) layer 14 in a direction perpendicular to the film thickness direction, and then calculating the average value of ten particles for each location.

In the present invention, the average layer thickness is obtained by taking the scanning electron microscopic (SEM) photographs of five locations on an arbitrary fracture surface including the interface between the substrate and the coating layer, or the interfaces of the individual layers in the coating layer, and measuring the respective layer thicknesses at several locations, and then calculating the average value thereof.

The number of the cobalt (Co) particles E in the aluminum oxide ($Al_2O_3$) layer 14 included in a reference length of 10 μm parallel to the interface between the intermediate layer 12 and the aluminum oxide ($Al_2O_3$) layer 14 is preferably 3 to 20.

In the above-mentioned range, the cobalt (Co) particles E having excellent toughness can be dispersed with proper spacing in the aluminum oxide ($Al_2O_3$) layer 14. Therefore, in the above-mentioned range, the strength of the hard layer 8 can be improved without lowering wear resistance.

Here, the number of cobalt (Co) particles E in the aluminum oxide ($Al_2O_3$) layer 14 is obtained in the following procedures. That is, a plane inclined at 15 to 20° with respect to the plane of the coating layer 8 is ground and mirror-finished. Thereafter, backscattered electron images are taken by a scanning electron microscope (SEM) at magnifications of ×5000 to ×20000, and the number of cobalt (Co) particles E in the reference length of 10 μm substantially parallel to the interface between the intermediate layer 12 and the aluminum oxide ($Al_2O_3$) layer 14. The above measurement at five locations is carried out for each sample, and its average value is used as the number of the cobalt (Co) particles E.

In the cutting insert shown in FIG. 1, the hard layer 8 at the cutting edge 6 is thinner than that corresponding to the cutting edge portion because the surface layer 15 is grounded. Preferably, the aluminum oxide ($Al_2O_3$) layer 14 is exposed. In this case, build-up resistance and wear resistance of the aluminum oxide ($Al_2O_3$) layer 14 enable to improve the cutting performance as a cutting tool.

The individual layers will be described below.

(a) Titanium Nitride (TiN) Layer 10

Preferably, the titanium nitride (TiN) layer 10 exists between the substrate 2 and the titanium carbonitride layer (TiCN) layer 11, and is deposited in a layer thickness of 0.1 to 1 μm in order to improve the adhesion of the titanium carbonitride layer (TiCN) layer 11 and prevent the wear resistance of the coating layer 8 from being lowered due to the diffusion of the composition of the substrate 2. The crystal structure may have any one of a granular, a rice grain and a columnar shape. The formation within the above-mentioned range enables to inhibit the diffusion of more composition of the substrate 2 than necessary, and improve the toughness of the coating layer 8.

(b) Titanium Carbonitride (TiCN) layer 11

Preferably, the titanium carbonitride (TiCN) layer 11 is deposited in an average layer thickness of 1.0 to 4 μm in order to absorb the shock exerted on the coating layer 8 and improve the fracture resistance of the coating layer 8. Preferably, the titanium carbonitride (TiCN) layer 11 has a crystal structure extending in a direction substantially perpendicular to the surface of the substrate 2. This enables to improve the toughness of the coating layer 8.

The titanium carbonitride (TiCN) layer 11 is preferably constituted from the aggregate of titanium carbonitride (TiCN) particles having a fine diameter (hereinafter referred to as fine titanium carbonitride (TiCN) particles) when the layer 11 is viewed from the direction of the surface thereof. Preferably, these fine titanium carbonitride (TiCN) particles extends in random directions, respectively, when the titanium carbonitride (TiCN) layer 11 is viewed from the direction of the surface thereof. This further enhances crack deflection effect. This also suppresses the crack propagation in the depth direction of the titanium carbonitride (TiCN) layer 11, thereby improving fracture resistance.

From the observations in the sectional direction and the surface direction, it is assumed that the fine titanium carbonitride (TiCN) particles are changed into plate-shaped crystals. The aspect ratio of the particles (the above-mentioned fine titanium carbonitride particles) can be estimated by finding a value to obtain the maximum value of the ratio of the length of the short axis orthogonal to the long axis of each particle to the length of the long axis of each particle, and obtaining an average value of the aspect ratios of the individual titanium carbonitride (TiCN) particle existing within a visual field. Alternatively, it may be a mixed crystal in which granular TiCN crystals are mixed at 30% by area in the observation of the sectional structure of the coating layer 8.

In the vicinity of the surface of the titanium carbonitride (TiCN) layer 11, namely in a thickness region of 0.05 to 0.5 μm adjacent to the intermediate layer 12, the average crystal width may be larger than that on the lower side.

(c) Intermediate Layer 12

The intermediate layer 12 is composed of at least one selected from the group consisting of titanium oxycarbide (TiCO), titanium oxynitride (TiNO), titanium carboxynitride (TiCNO) and titanium oxide ($Ti_2O_3$, $TiO_2$). The intermediate layer 12 exists between (b) the titanium carbonitride (TiCN) layer 11 and (d) a later-described aluminum oxide ($Al_2O_3$) layer 14, and has the effect of changing the crystal of the aluminum oxide ($Al_2O_3$) layer 14 into the crystal structure of α-aluminum oxide (α-$Al_2O_3$).

Preferably, the intermediate layer 12 has an average layer thickness of 0.05 to 0.4 μm. In this range, the generation of α-aluminum oxide is facilitated, in addition to improving hardness and strength of the aluminum oxide ($Al_2O_3$) layer 14. The crystal structure may have any one of a granular shape, a rice grain shape and a columnar shape, and more preferably the columnar crystal structure as in the case for the titanium carbonitride (TiCN) layer 11.

Preferably, toward the aluminum oxide ($Al_2O_3$) layer 14 from the intermediate layer 12, protruding particles 13 composed of at least one selected from the group consisting of titanium oxycarbide (TiCO), titanium oxynitride (TiNO), titanium oxycarbonitride (TiCNO) and titanium oxide ($Ti_2O_3$, $TiO_2$) are dotted in an average crystal height of 0.05 to 0.4 μm, and merge into the ($Al_2O_3$) layer 14. This further enhances the adhesion between the intermediate layer 12 and the aluminum oxide ($Al_2O_3$) layer 14.

It is also desirable that in order to increase the adhesion between the intermediate layer 12 and the aluminum oxide ($Al_2O_3$) layer 14, at least one of the intermediate layer 12 and the protruding particles 13 contain titanium oxide ($Ti_2O_3$), and in the X-ray diffraction pattern of the surface of the coating layer 8, the ratio between a peak intensity $I_{Al2O3}$ of the aluminum oxide ($Al_2O_3$) layer 14 and a peak intensity $I_{Ti2O3}$ of the (012) of $Ti_2O_3$ of the intermediate layer 12 or the protruding particles 13, ($I_{Ti2O3}/I_{Al2O3}$), is in the range of 0.1 to 0.7.

(d) Aluminum Oxide ($Al_2O_3$) Layer 14

Preferably, the aluminum oxide ($Al_2O_3$) layer 14 is composed of aluminum oxide having an α type crystal structure (α-$Al_2O_3$), and exists in an average layer thickness of 0.1 to 0.45 μm. The crystal structure thereof is preferably a granular crystal structure.

The aluminum oxide ($Al_2O_3$) layer 14 having an α type crystal structure is structurally stable and capable of maintaining excellent wear resistance even under high temperatures. Heretofore, the aluminum oxide having an α-$Al_2O_3$ has had excellent wear resistance. However, due to a large particle size at the time of core formation, the area contacted with the titanium carbonitride (TiCN) layer 11 is reduced to cause weak adhesion, thus being susceptible to film peeling. In contrast, the above-mentioned structural improvement provides excellent adhesion between the aluminum oxide ($Al_2O_3$) layer 14 and the titanium carbonitride (TiCN) layer 11. Consequently, the excellent wear resistance of the aluminum oxide (α-$Al_2O_3$) crystals having an α-$Al_2O_3$ can be obtained without reducing the adhesion of the aluminum oxide ($Al_2O_3$) layer 14, thus achieving the cutting insert 1 having a longer tool life.

Under the definition that at the interface of the aluminum oxide ($Al_2O_3$) layer 14 adjacent to the substrate 2, the maximum height Rz with respect to a reference length of 5 μm is 0.1 to 0.5 μm and, with respect to a reference line passing through a midpoint between the highest position and the lowest position in the reference length of 5 μm, a portion projecting upward from the reference line is a convex portion, the number of the convex portions in the reference length of 5 μm is preferably 4 to 15 in order to enhance the adhesion between the intermediate layer 12 and the $Al_2O_3$ layer 14.

The above definition at the interface of the aluminum oxide ($Al_2O_3$) layer 14 adjacent to the substrate 2 is to define the value when the reference length is set to 5 μm according to the method of calculating the maximum height (Rz) defined by JIS B 0601-2001 (ISO4287-1997), from the traced line of the concave-convex shape at the interface of the aluminum oxide ($Al_2O_3$) layer 14 adjacent to the substrate 2 in the structural observation of the coating layer 8.

The number of the convex portions in the reference length 5 μm can be obtained from the above-mentioned traced line L, by using the method shown in FIG. 4. Specifically, the surface roughness at the interface is measured as follows. That is, the cut surface or the fracture surface of the tool 1 is observed by a scanning electron microscope (SEM) at magnifications of ×5000 to ×20000. Letting a reference line C be a line passing through the highest convex portion at the interface between the substrate 2 and the coating layer 8, and passing through a straight line A substantially parallel to the substrate 2 to the deepest concave portion, and then passing through the midpoint of the shortest distance M up to a straight line B substantially parallel to the substrate 2, and finally being parallel to the substrate 2. Those projecting from the reference line C are taken as convex portions, and those being located below the reference line C are taken as concave portions. Based on the reference line C, the number of the convex portions is counted (two in FIG. 4) to obtain a result (refer to FIG. 4). For this measurement, the tracing and the measurement are carried out with the exclusion of the locations of the protruding particles 13.

(e) Surface Layer 15

The surface layer 15 is composed of at least one selected from the group consisting of titanium nitride (TiN), zirconium nitride (ZrN) and hafnium nitride (HfN), and formed in an average layer thickness of 0.1 to 2 μm. This enables adjustments of the slidability, appearance and the surface of the coating layer. That is, the tool provided with the surface layer 15 has a gold color, and when the cutting insert 1 is used, the surface layer is worn to help distinguish whether it has been used or not. It is also easy to confirm the progress of wear.

<Manufacturing Method>

A method of manufacturing a cutting insert as an example of the cutting tools of the invention will be described below.

Firstly, metal powder and carbon powder are suitably added to and mixed with inorganic powder such as metal carbides, nitrides, carbonitrides or oxides, which are capable of forming the above-mentioned hard alloy by sintering. The granulated mixture is then formed into a predetermined tool shape by any known molding method such as dry press molding, injection molding, slip casting, extrusion molding or cold isostatic press molding. A substrate 2 composed of the above-mentioned hard alloy is manufactured by sintering in vacuum or a non-oxidizing atmosphere. If necessary, grinding is applied to the surface of the substrate 2, and horning is applied to the cutting edge.

In terms of the surface roughness of the substrate 2, the particle size of material powder, molding method, sintering method and grinding method are determined so that the arithmetic mean roughness (Ra) on the face is 0.1 to 1.5 μm, and the arithmetic mean roughness (Ra) on the flank is 0.5 to 3 μm, in order to control the adhesion of a coating layer 8.

Subsequently, the coating layer 8 is deposited on the surface of the substrate 2 by chemical vapor deposition (CVD) method In the preprocessing step, the substrate is retained in a CVD furnace by introducing into the CVD furnace a mixed gas prepared by mixing hydrogen ($H_2$) in the range of 50 to 75 vol % and nitrogen ($N_2$) in the range of 25 to 50 vol %, totaling 100 vol %, while performing control so that a Vg/Vr is 0.1 to 0.3, where Vg is the volume (flow rate) of the introduced gas at room temperature and atmospheric pressure, and Vr is the volume of the inside of the CVD furnace. This preprocessing step enables elimination of any impurities or dirt on the substrate surface, thus producing a state that facilitates diffusion of cobalt (Co) into the coating layer 8.

Next, in the step of forming a titanium nitride (TiN) layer 10, the titanium nitride (TiN) layer 10 is deposited on the substrate 2 by the CVD method in the CVD furnace by introducing supplying a mixed gas prepared by mixing titanium chloride ($TiCl_4$) in the range of 0.3 to 1.2 vol %, hydrogen ($H_2$) in the range of 35 to 65 vol % and nitrogen ($N_2$) in the range of 35 to 65 vol %, totaling 100 vol %, while performing control so that the Vg/Vr is 0.7 to 1.1 at constant pressure.

Subsequently, in the mid-processing step, the substrate provided with the titanium nitride layer is retained in the CVD furnace by introducing a mixed gas prepared by mixing hydrogen ($H_2$) in the range of 50 to 75 vol % and nitrogen ($N_2$) in the range of 25 to 50 vol %, totaling 100 vol %, while performing control so that the Vg/Vr is 0.1 to 0.3. Preferably, this processing time is about 10 to 60 minutes, the pressure within the CVD furnace is 10 to 30 kPa, and the processing temperature is 800 to 900° C.

The mid-processing step enables elimination of any impurities or dirt on the surface of the titanium nitride (TiN) layer 10, thus producing a state that facilitates diffusion of cobalt (Co) into the upper layer than the titanium nitride (TiN) layer 10.

Subsequently, in the step of forming a titanium carbonitride (TiCN) layer 11, a titanium carbonitride (TiCN) layer 11 is deposited on the titanium nitride (TiN) layer 10 by the CVD method in the CVD furnace by introducing a mixed gas prepared by mixing titanium chloride ($TiCl_4$) in the range of 0.5 to 5 vol %, acetonitrile ($CH_3CN$) in the range of 0.3 to 1.5 vol %, nitrogen ($N_2$) in the range of 10 to 40 vol % and the remainder, namely hydrogen ($H_2$), totaling 100 vol %.

By adjusting the proportion of the acetonitrile in the gas to the above-mentioned range under the above deposition conditions, the structure of titanium carbonitride (TiCN) particles within the titanium carbonitride (TiCN) layer 11 can be surely grown in the above-mentioned range. The above-mentioned deposition temperature of 780 to 880° C. is suitable for depositing the protruding particles composed of titanium carbonitride (TiCN), having a columnar structure in the cross-sectional observation and having a fine diameter in the surface observation.

In the deposition step of the titanium carbonitride (TiCN) layer 11, the introduction of the acetonitrile ($CH_3CN$) in the reaction gas used in the first half of the deposition step of forming the titanium carbonitride (TiCN) layer 11 may be discontinued in the second half thereof so as to increase the average crystal width of the titanium carbonitride (TiCN) crystals adjacent to the surface of the titanium carbonitride (TiCN) layer 11 (i.e. on the intermediate layer side). Under the above-mentioned deposition conditions, in the growth step of the titanium carbonitride (TiCN) crystals in the first half of the deposition step of the titanium carbonitride (TiCN) layer 11, the proportion $V_A$ of the acetonitrile ($CH_3CN$) gas is controlled to 0.3 to 1.5 vol %, and ratio ($V_A/V_H$) between a proportion $V_H$ of hydrogen ($H_2$) gas as a carrier gas and a proportion $V_A$ of acetonitrile ($CH_3CN$) is controlled at a low concentration of below 0.03. This enables fine core formation to improve the adhesion of the titanium carbonitride (TiCN) layer.

Next, an intermediate layer 12 is formed. When a titanium oxycarbonitride (TiCNO) layer is deposited as the intermediate layer 12, a mixed gas is prepared by mixing titanium chloride ($TiCl_4$) gas in the range of 0.1 to 3 vol %, methane ($CH_4$) gas in the range of 0.1 to 10 vol %, carbon dioxide ($CO_2$) gas in the range of 0.01 to 5 vol %, nitrogen ($N_2$) gas in the range of 0 to 60 vol % and the remainder, namely hydrogen ($H_2$) gas. The mixed gas is then introduced into a reaction chamber whose inside is set at 800 to 1100° C. and 5 to 30 kPa.

In the deposition conditions for deposition of the titanium oxycarbonitride (TiCNO) layer as the intermediate layer 12, the ratio of the flow rate of carbon dioxide ($CO_2$) gas to the flow rate of titanium chloride ($TiCl_4$) gas, $CO_2/TiCl_4$, is preferably controlled to 1.8 to 4.0. This enables to control so that the maximum height Rz with respect to the reference length 5 μm is 0.1 to 0.5 μm, and the number of the convex portions in the reference length 5 μm is 4 to 15. It is therefore capable of enhancing the adhesiveness between the intermediate layer 12 and the aluminum oxide ($Al_2O_3$) layer 14.

The formation of the protruding particles 13 is facilitated by controlling the above-mentioned flow rate ratio at 2.0 to 3.0.

Thereafter, in the post-processing step, the substrate provided with the intermediate layer 12 is retained by introducing a mixed gas prepared by mixing aluminum chloride ($AlCl_3$) in the range of 1 to 15 vol % and the remainder, namely hydrogen ($H_2$), totaling 100 vol %. This processing is preferably carried out for about 15 to 60 minutes and at pressure of 5 to 30 kPa and a temperature of 950 to 1150° C.

The above post-processing step facilitates deposition of cobalt (Co) particles on an aluminum oxide ($Al_2O_3$) layer 14.

Subsequently, the aluminum oxide ($Al_2O_3$) layer 14 is formed. Preferably, the aluminum oxide ($Al_2O_3$) layer 14 is deposited at 900 to 1100° C. and 5 to 10 kPa by using a mixed gas consisting of aluminum chloride ($AlCl_3$) gas in the range of 3 to 20 vol %, hydrogen chloride (HCl) gas in the range of 0.5 to 3.5 vol %, carbon dioxide ($CO_2$) gas in the range of 0.01 to 5 vol %, hydrogen sulfide ($H_2S$) gas in the range of 0 to 0.01 vol % and the remainder, namely hydrogen ($H_2$) gas.

Subsequently, a surface layer 15 is formed. For example, when a titanium nitride (TiN) layer is deposited as the surface layer 15, as a reaction gas composition, a mixed gas is prepared by mixing titanium chloride ($TiCl_4$) gas in the range of 0.1 to 10 vol %, nitrogen ($N_2$) gas in the range of 10 to 60 vol % and the remainder, namely hydrogen ($H_2$) gas. The mixed gas is then introduced into the reaction chamber whose inside is set at 800 to 1100° C. and 50 to 85 kPa.

In the manufacturing methods of related technique, it has been known to improve the adhesion between the substrate and the coating layer by diffusing the component constituting the substrate into the coating layer, as in the case with the document 1 and the document 2. However, it has been difficult to obtain sufficient fracture resistance, and the fracture of the cutting edge occurs in heavy cutting and continuous cutting such as high feed rate cutting and an interrupted cutting, making it difficult to maintain excellent cutting performance over a long period of time.

The present applicant (inventor) therefore had repetitively conducted experiments and succeeded in incorporating particles composed mainly of cobalt into an aluminum oxide layer, which has been attempted without success, by performing the following steps: (1) the preprocessing step performed before depositing a titanium nitride layer on the substrate surface; (2) the mid-processing step performed after depositing the titanium nitride layer and before depositing a titanium carbonitride layer; and (3) the post-processing step performed after depositing an intermediate layer and before depositing an aluminum oxide layer.

That is, owing to the preprocessing step, the mid-processing step and the post-processing step, the cobalt composition diffused from the substrate can be absorbed into the aluminum oxide ($Al_2O_3$) layer. This enables the particles composed mainly of cobalt to be deposited on the aluminum oxide ($Al_2O_3$) layer.

Further, only the cutting edge 6 or the face 3 including the cutting edge 6 is mechanically ground by using a brush, an elastic grindstone or blast method, so that the surface layer 15 at the cutting edge 6 is ground to reduce its thickness or expose the aluminum oxide ($Al_2O_3$) layer 14. By this grinding process, the residual stress remaining in the coating layer is released, and the aluminum oxide ($Al_2O_3$) layer 14 is exposed to the cutting edge 6, or the aluminum oxide ($Al_2O_3$) layer 14 exists in the vicinity of the surface of the coating layer 8. This provides the cutting insert 1 suppressing the build-up of work material and having excellent wear resistance.

A cutting method of the invention will be described below.

FIG. 5 to 7 show the process drawings of the cutting method of the invention. Firstly, the cutting insert of the invention is mounted on the cutting tool 1 according to the invention (a turning tool is exemplified in these drawings). As shown in FIG. 5, the cutting edge of the cutting tool 1 is brought near a work material 50. It is necessary to cause the cutting tool 1 and the work material 50 to approach each other. For example, the work material 50 may be brought near the cutting edge of the cutting tool 1.

Subsequently, at least one of the work material 50 and the cutting tool 1 is rotated. FIG. 5 to 7 show a case where the work material is rotated. Next, as shown in FIG. 6, the work material 50 is cut by bringing the cutting edge portion of the cutting tool 1 into contact with the work material 50. Thereafter, as shown in FIG. 7, the cutting tool 1 is moved away from the work material 50. When the cutting process is continued, the step of bringing the cutting edge of the cutting tool 1 into contact with other location of the work material 50 is repeated, while holding the relative rotative state between the cutting tool 1 and the work material 50.

Several embodiment examples of the invention will be described with reference to the following tables.

Example 1

A 90 wt % of tungsten carbide (WC) powder having an average particle size of 1.4 μm, 8 wt % of metal cobalt (Co) powder having an average particle size of 1.6 μm, 0.3 wt % of titanium carbide (TiC) powder having an average particle size of 1.5 μm, 1.2 wt % of TaC powder having an average particle size of 1.4 μm, and 0.5 wt % of NbC powder having an average particle size of 1.5 μm were added and mixed together. The mixed powder was press-formed into a cutting tool shape (CNMG120408). This was subjected to debinding process and then firing at 1500° C. for one hour in vacuum of 0.01 Pa, thereby manufacturing cemented carbide.

The cutting tools (throw-away tips) of Sample Nos. 1 to 16 were manufactured by using the above cemented carbide as a substrate, and sequentially performing the preprocessing step, the titanium nitride (TiN) layer deposition step, the mid-processing step, the titanium carbonitride (TiCN) layer deposition step, the intermediate layer deposition step, the post-processing step, the aluminum oxide ($Al_2O_3$) layer deposition step and the titanium nitride (TiN) surface layer deposition step under their corresponding conditions described in Tables 1 and 2.

TABLE 1

| Coating layer | Composition of mixed gas (vol %) | Vg/Vr[1] | Deposition temperature (° C.) | Pressure (kPa) |
|---|---|---|---|---|
| Preprocessing step 1 | $N_2$: 34, $H_2$: The rest | 0.19 | 880 | 16 |
| Preprocessing step 2 | $N_2$: 25, $H_2$: The rest | 0.12 | 900 | 29 |
| Preprocessing step 3 | $N_2$: 48, $H_2$: The rest | 0.28 | 850 | 10 |
| Preprocessing step 4 | $N_2$: 0, $H_2$: The rest | 0.26 | 880 | 15 |
| TiN1 | $TiCl_4$: 1.0, $N_2$: 50, $H_2$: The rest | 0.83 | 900 | 10 |
| TiN2 | $TiCl_4$: 0.8, $N_2$: 40, $H_2$: The rest | 0.9 | 880 | 16 |
| TiN3 | $TiCl_4$: 1.0, $N_2$: 50, $H_2$: The rest | 0.56 | 880 | 18 |
| TiN4 | $TiCl_4$: 4.0, $N_2$: 35, $H_2$: The rest | 0.45 | 800 | 12 |
| Mid-processing step 1 | $N_2$: 33, $H_2$: The rest | 0.19 | 845 | 9 |
| Mid-processing step 2 | $N_2$: 27, $H_2$: The rest | 0.12 | 880 | 20 |
| Mid-processing step 3 | $N_2$: 50, $H_2$: The rest | 0.28 | 880 | 20 |
| Mid-processing step 4 | $N_2$: 0, $H_2$: The rest | 0.26 | 820 | 6 |
| TiCN1 | $TiCl_4$: 2.0, $N_2$: 23, $CH_3CN$: 0.6, $H_2$: The rest | — | 865 | 9 |
| TiCN2 | $TiCl_4$: 5.0, $N_2$: 39, $CH_3CN$: 0.3, $H_2$: The rest | — | 820 | 5 |
| TiCN3 | $TiCl_4$: 0.5, $N_2$: 11, $CH_3CN$: 1.5, $H_2$: The rest | — | 755 | 18 |
| TiCN4 | $TiCl_4$: 1.7, $N_2$: 35, $CH_4$: 6.0, $H_2$: The rest | — | 1010 | 30 |
| TiCNO1 | $TiCl_4$: 1.6, $CH_4$: 3.3, $N_2$: 16.5, $CO_2$: 4.0, $H_2$: The rest | — | 1010 | 7.0 |
| TiCNO2 | $TiCl_4$: 2.0, $CH_4$: 4.0, $N_2$: 20, $CO_2$: 2.5, $H_2$: The rest | — | 1010 | 7.0 |
| Post-processing step 1 | $AlCl_3$: 7.0, H2: The rest | — | 1015 | 16.0 |
| Post-processing step 2 | $AlCl_3$: 14.5, H2: The rest | — | 1005 | 5.0 |
| Post-processing step 3 | $AlCl_3$: 1.0, H2: The rest | — | 1050 | 24.0 |
| Post-processing step 4 | $AlCl_3$: 0.5, H2: The rest | — | 950 | 1.0 |
| $Al_2O_3$1 | $AlCl_3$: 1.6, $CO_2$: 3.8, $H_2S$: 0.03, $H_2$: The rest | — | 1010 | 9 |
| $Al_2O_3$2 | $AlCl_3$: 1.8, $CO_2$: 3.5, $H_2S$: 0.06, $H_2$: The rest | — | 1010 | 9 |
| TiN5 | $TiCl_4$: 2.0, $N_2$: 30, $H_2$: The rest | — | 1010 | 50 |
| TiN6 | $TiCl_4$: 2.0, $N_2$: 40, $H_2$: The rest | — | 1010 | 20 |

[1]Vg/Vr in the column of the coating layer depositing conditions is obtained by dividing the supply flow rate Vg (L/min) into the furnace by effective volume of the inside of the furnace Vr (L).

TABLE 2

| Sample No. | Pre-processing step[2] | Film composition[3] | | | | | | | Film thickness (μm) | Co particle in alumina layer | | |
|---|---|---|---|---|---|---|---|---|---|---|---|---|
| | | TiN | Mid-processing step | TiCN | HT-TiCN | TiCNO | Post-processing step | $Al_2O_3$ | TiN | | Presence/absence | Particle size (μm) | Composition (wt %) |
| 1 | Pre-processing step 1 [15] | TiN1 (0.2) | Mid-processing step 1 [25] | TiCN1 (2.1) | TiCN3 (0.3) | TiCNO1 (0.05) | Post-processing step 1 [34] | α-$Al_2O_3$ (0.4) | TiN5 (0.5) | 3.6 | Presence | 0.21 | Co: 96, Ti: 3, Al: 1 |

TABLE 2-continued

| | | | | Film composition[3] | | | | | | Film thickness (μm) | Co particle in alumina layer | | |
|---|---|---|---|---|---|---|---|---|---|---|---|---|---|
| Sample No. | Pre-processing step[2] | TiN | Mid-processing step | TiCN | HT-TiCN | TiCNO | Post-processing step | Al₂O₃ | TiN | | Presence/absence | Particle size (μm) | Composition (wt %) |
| 2 | Pre-processing step 2 [30] | TiN2 (0.3) | Mid-processing step 2 [15] | TiCN1 (2.2) | TiCN3 (0.5) | TiCNO2 (0.1) | Post-processing step 2 [15] | α-Al₂O₃ (0.5) | TiN6 (0.5) | 4.1 | Presence | 0.05 | Co: 98, Ti: 2 |
| 3 | Pre-processing step 3 [25] | TiN1 (0.4) | Mid-processing step 3 [60] | TiCN2 (3.2) | TiCN3 (0.5) | TiCNO2 (0.1) | Post-processing step 3 [60] | α-Al₂O₃ (0.7) | TiN5 (0.7) | 5.6 | Presence | 0.4 | Co: 92, Ti: 4, Al: 2, C: 1 |
| 4 | Pre-processing step 2 [15] | TiN1 (0.1) | Mid-processing step 1 [40] | TiCN2 (1.0) | TiCN4 (0.05) | TiCNO1 (0.05) | Post-processing step 3 [30] | α-Al₂O₃ (0.2) | TiN5 (0.1) | 1.5 | Presence | 0.28 | Co: 96, Ti: 4 |
| 5 | Pre-processing step 2 [10] | TiN2 (0.2) | Mid-processing step 3 [60] | TiCN1 (3.4) | TiCN4 (0.2) | TiCNO2 (0.1) | Post-processing step 1 [20] | α-Al₂O₃ (0.4) | TiN5 (0.4) | 4.7 | Presence | 0.25 | Co: 97, Ti: 3 |
| 6 | Pre-processing step 1 [45] | TiN2 (1.0) | Mid-processing step 2 [30] | TiCN2 (0.8) | — | TiCNO1 (0.05) | Post-processing step 1 [25] | α-Al₂O₃ (0.2) | TiN5 (0.15) | 1.3 | Presence | 0.34 | Co: 97, Ti: 1, Al 1 |
| 7 | Pre-processing step 2 [35] | TiN1 (0.1) | Mid-processing step 1 [25] | TiCN1 (2.0) | TiCN4 (0.2) | TiCNO2 (0.1) | Post-processing step 3 [35] | α-Al₂O₃ (0.2) | TiN6 (0.2) | 2.8 | Presence | 0.26 | Co: 97, Ti: 2, Al: 1 |
| 8 | Pre-processing step 1 [15] | TiN2 (0.4) | Mid-processing step 3 [60] | TiCN2 (3.8) | TiCN4 (0.5) | TiCNO2 (01) | Post-processing step 2 [55] | α-Al₂O₃ (0.5) | TiN5 (0.5) | 5.9 | Presence | 0.37 | Co: 90, Ti: 7, Al: 3 |
| 9 | Pre-processing step 1 [20] | TiN1 (0.1) | Mid-processing step 2 [15] | TiCN1 (5.8) | — | TiCNO1 (0.4) | Post-processing step 2 [30] | α-Al₂O₃ (0.1) | TiN5 (0.3) | 6.7 | Presence | 0.24 | Co: 97, Ti: 3 |
| 10 | Pre-processing step 2 [45] | TiN2 (0.9) | Mid-processing step 2 [15] | TiCN2 (4.5) | TiCN4 (0.5) | TiCN02 (0.05) | Post-processing step 1 [15] | α-Al₂O₃ (0.45) | TiN6 (0.7) | 7.1 | Presence | 0.14 | Co: 99, Ti: 1 |
| 11 | — | TiN1 (0.3) | Mid-processing step 1 [20] | TiCN2 (2.5) | TiCN4 (0.5) | TiCN02 (0.1) | Post-processing step 2 [25] | α-Al₂O₃ (0.3) | TiN6 (0.8) | 4.5 | Absence | — | — |
| 12 | Pre-processing step 2 [20] | TiN2 (0.4) | — | TiCN1 (2.8) | TiCN3 (0.5) | TiCNO1 (0.05) | Post-processing step 3 [20] | α-Al₂O₃ (0.4) | TiN5 (0.2) | 4.4 | Absence | — | — |
| 13 | Pre-processing step 2 [25] | TiN1 (0.1) | Mid-processing step 2 [20] | TiCN2 (3.3) | TiCN4 (0.5) | — | — | κ-Al₂O₃ (0.3) | TiN5 (0.5) | 4.9 | Absence | — | — |
| 14 | Pre-processing step 3 [15] | TiN3 (0.6) | Mid-processing step 4 [30] | TiCN2 (2.8) | TiCN3 (0.5) | TiCNO2 (0.1) | Post-processing step 3 [25] | α-Al₂O₃ (0.3) | TiN6 (0.7) | 5.0 | Absence | — | — |
| 15 | Pre-processing step 1 [20] | TiN4 (0.4) | Mid-processing step 1 [15] | TiCN1 (3.4) | TiCN4 (0.5) | TiCNO1 (0.05) | Post-processing step 4 [20] | α-Al₂O₃ (0.3) | TiN5 (0.7) | 5.4 | Absence | — | — |
| 16 | Pre-processing step 1 [21] | TiN1 (0.5) | Mid-processing step 1 [25] | — | TiCN4 (4.2) | TiCNO1 (0.05) | Post-processing step 1 [15] | α-Al₂O₃ (0.2) | TiN5 (0.5) | 5.5 | Absence | — | — |

[2] [ ] stands for processing time. Unit: minute
[3] ( ) stands for layer thickness. Unit: μm The particles composed mainly of cobalt (Co) in the aluminum oxide (Al₂O₃) layer were confirmed by observing the interface including the aluminum oxide (Al₂O₃) layer through a high-resolution transmission electron microscope (HR-TEM). As can be seen from the results shown in Table 2, in Sample Nos. 1 to 10 obtained by the manufacturing method of the invention, the particles E composed mainly of cobalt (Co) were incorporated into the aluminum oxide (Al₂O₃) layer as shown in FIG. 1. On the other hand, in Sample Nos. 11 to 16, no particle composed mainly of cobalt existed in the aluminum oxide (Al₂O₃) layer.

Each of the throw-away tips of Sample Nos. 1 to 16 was mounted on a holder. Under the following conditions, a cutting test was conducted to measure wear resistance (such as flank wear and boundary wear), fracture resistance and blade edge condition. The results are presented in Table 3.

<Cutting Conditions>
(1) Wear Resistance Test
Work material: SUS304 cylindrical material
Tool shape: CNMG120408
Notching speed: 200 m/min
Feed rate: 0.2 mm/rev
Depth of cut: 1.5 mm
Cutting time: 20 min
Cutting state: Wet cutting
(2) Fracture Resistance Test
Work material: SUS304 grooved cylindrical material
Tool shape: CNMG120408
Notching speed: 170 m/min
Feed rate: 0.3 mm/rev
Depth of cut: 1.5 mm
Cutting state: Wet cutting

TABLE 3

| Sample No. | Wear test: Wear amount (mm) | | Fracture resistance test Number of shocks leading to a fracture (number of times) | cutting edge condition |
|---|---|---|---|---|
| | Flank wear | Boundary wear | | |
| 1 | 0.12 | 0.20 | 1800 | No damage |
| 2 | 0.16 | 0.25 | 1600 | No damage |
| 3 | 0.20 | 0.25 | 1800 | No damage |
| 4 | 0.15 | 0.26 | 1450 | No damage |
| 5 | 0.16 | 0.25 | 1550 | No damage |
| 6 | 0.18 | 0.28 | 1700 | No damage |
| 7 | 0.15 | 0.25 | 1600 | No damage |
| 8 | 0.09 | 0.30 | 1100 | No damage |
| 9 | 0.13 | 0.27 | 1200 | No damage |
| 10 | 0.09 | 0.29 | 1000 | No damage |
| 11 | 0.22 | 0.37 | 700 | Film peeling |
| 12 | 0.23 | 0.33 | 700 | Chipping and film peeling |
| 13 | 0.24 | 0.40 | 600 | Film peeling |
| 14 | 0.26 | 0.39 | 700 | Chipping |
| 15 | 0.25 | 0.45 | 500 | Chipping and film peeling |
| 16 | 0.35 | 0.60 | 800 | Chipping and film peeling |

As can be seen from Table 3, Sample Nos. 1 to 10 incorporating the particles composed mainly of cobalt (Co) into the aluminum oxide ($Al_2O_3$) layer were superior to Sample Nos. 11 to 16 incorporating no particles composed mainly of cobalt (Co) into the aluminum oxide ($Al_2O_3$) layer, in all respects of flank wear, boundary wear, fracture resistance test and blade edge condition.

The reason is considered to be that the existence of the particles composed mainly of cobalt having excellent ductility in the aluminum oxide ($Al_2O_3$) layer imparted both high hardness and high toughness, enabling to suppress the occurrence of cracks in the aluminum oxide ($Al_2O_3$) layer when a strong shock is generated during heavy intermittent cutting. It is also considered that even if cracks occur in the surface layer, the aluminum oxide ($Al_2O_3$) layer incorporating the particles composed mainly of cobalt (Co) of high toughness was capable of suppressing crack propagation.

Example 2

To tungsten carbide (WC) powder having an average particle size of 1.5 μm, 6 wt % of metal cobalt (Co) powder having an average particle of 1.2 μm, 0.5 wt % of titanium carbide (TiC) powder having an average particle size of 2.0 μm, and 5 wt % of tantalum carbide (TaC) were added and mixed together. The agglomerated powder was press-formed into a cutting tool shape (CNMG120408). This was subjected to debinding process and then sintering at 1500° C. for one hour in vacuum of 0.01 Pa, thereby manufacturing cemented carbide. The manufactured cemented carbide was subjected to cutting edge treatment (horning R) by means of brushing from the face. The arithmetic mean roughness (Ra) according to JISB0601-2001 of the flank of the obtained substrate was 1.1 μm, and that of the rake was 0.4 μm.

Subsequently, various types of coating layers constructed from a multilayer having the constituents shown in Table 5 were deposited on the above cemented carbide by CVD method. The deposition conditions of the individual layers in Table 5 are presented in Table 4. The surface of the coating layer was brushed from the rake side to the cutting edge so that the cutting edge had the state shown in Table 5, thereby manufacturing a surface coated throw-away tip.

TABLE 4

| Coating layer | Composition of mixed gas (vol %) | $V_{TiCl4}/Va$[1] | $CO_2/TiCl_4$[2] | Deposition temperature (° C.) | Pressure (kPa) |
|---|---|---|---|---|---|
| TiN1 | $TiCl_4$: 2.0, $N_2$: 30, $H_2$: The rest | — | — | 865 | 16 |
| TiCN1 | $TiCl_4$: 1.7, $N_2$: 43, $CH_3CN$: 0.5, $H_2$: The rest | — | — | 865 | 9 |
| TiCN2 | $TiCl_4$: 1.7, $N_2$: 35, $CH_4$: 6, $H_2$: The rest | — | — | 1010 | 15 |
| TiCNO1 | $TiCl_4$: 2.1, $CH_4$: 4.2, $N_2$: 20.8, $CO_2$: 5.2, $H_2$: The rest | $3.0 \times 10^{-5}$ | 2.5 | 1010 | 7.0 |
| TiCNO2 | $TiCl_4$: 2.2, $CH_4$: 4.6, $N_2$: 41.5, $CO_2$: 5.6, $H_2$: The rest | $3.5 \times 10^{-5}$ | 2.6 | 1010 | 7.0 |
| TiCNO3 | $TiCl_4$: 1.3, $CH_4$: 7.1, $N_2$: 53.1, $CO_2$: 3.2, $H_2$: The rest | $2.7 \times 10^{-5}$ | 2.5 | 1010 | 7.0 |
| TiCNO4 | $TiCl_4$: 1.6, $CH_4$: 6.1, $N_2$: 30.6, $CO_2$: 4.2, $H_2$: The rest | $3.2 \times 10^{-5}$ | 2.6 | 1010 | 7.0 |
| TiCNO5 | $TiCl_4$: 1.5, $CH_4$: 9.7, $N_2$: 45.4, $CO_2$: 1.2, $H_2$: The rest | $3.5 \times 10^{-5}$ | 0.8 | 1010 | 7.0 |
| TiCO1 | $TiCl_4$: 1.8, $CH_4$: 4.4, $CO_2$: 5.0, $H_2$: The rest | $2.8 \times 10^{-5}$ | 2.7 | 1010 | 9.0 |
| TiCO2 | $TiCl_4$: 1.3, $CH_4$: 8.6, $CO_2$: 3.6, $H_2$: The rest | $2.3 \times 10^{-5}$ | 2.7 | 1010 | 7.5 |
| TiCO3 | $TiCl_4$: 2.6, $CH_4$: 13.8, $CO_2$: 6.7, $H_2$: The rest | $3.5 \times 10^{-5}$ | 2.6 | 1010 | 9.5 |
| TiCO4 | $TiCl_4$: 4.7, $CH_4$: 13.3, $CO_2$: 5.6, $H_2$: The rest | $10.5 \times 10^{-5}$ | 1.2 | 1010 | 9.0 |
| TiCO5 | $TiCl_4$: 2.6, $CH_4$: 19.2, $CO_2$: 1.5, $H_2$: The rest | $3.0 \times 10^{-5}$ | 0.6 | 1010 | 7.5 |
| TiCO6 | $TiCl_4$: 0.8, $CH_4$: 12.2, $CO_2$: 2, $H_2$: The rest | $1.2 \times 10^{-5}$ | 2.3 | 1010 | 7.0 |
| TiNO1 | $TiCl_4$: 1.6, $N_2$: 27.4, $CO_2$: 4.1, $H_2$: The rest | $4.0 \times 10^{-5}$ | 2.5 | 1010 | 9.5 |

TABLE 4-continued

| Coating layer | Composition of mixed gas (vol %) | $V_{TiCl4}/Va^{1)}$ | $CO_2/TiCl_4{}^{2)}$ | Deposition temperature (° C.) | Pressure (kPa) |
|---|---|---|---|---|---|
| TiNO2 | $TiCl_4$: 0.6, $N_2$: 44.9, $CO_2$: 0.5, $H_2$: The rest | $1.5 \times 10^{-5}$ | 0.9 | 1010 | 9.0 |
| $Al_2O_3$ | $AlCl_3$: 1.6, $CO_2$: 3.7, HCl: 2.1, $H_2$: The rest | — | — | 1010 | 9 |
| TiN2 | $TiCl_4$: 2.0, $N_2$: 30, $H_2$: The rest | — | — | 1010 | 16 |

[1)] $V_{TiCl4}/Va$ in the column of the coating layer depositing conditions is obtained by dividing the total flow rate (L/min) of $TiCl_4$ and $CO_2$ by effective volume of the inside of the furnace (L).
[2)] $CO_2/TiCl_4$ in the column of the coating layer depositing conditions is the ratio of the flow rate (L/min) between $TiCl_4$ and $CO_2$.

With respect to the obtained tools, the scanning electron microscopic (SEM) photographs of five points on an arbitrary fracture surface including the cross-sectional view of the coating layer 8 were taken. On these photographs, the structural state of each coating layer was observed, and the layer thickness of each layer was measured, and the presence/absence of protruding particles was confirmed. The cross-sectional view of the tip of Sample No. 17 is shown in FIG. 3. From this photograph, the concave-convex at the interface of the aluminum oxide layer adjacent to the substrate was traced to measure the maximum roughness Rz and the number of convex portions. From the surface of the coating layer 8, an X-ray diffraction measurement was performed to confirm whether the peak of the (012) of titanium oxide ($Ti_2O_3$) existed or not. If existed, the ratio between the peak intensity $I_{Ti2O3}$ of the (012) of titanium oxide and the peak intensity $I_{Al2O3}$ of the (012) of aluminum oxide, $I_{Ti2O3}/I_{Al2O3}$, was calculated.

TABLE 5

| Sample No. | Hard coating layer[3)4)] (a) | (b) | (c) | (d) | (e) | Structural Observation protruding particles | $I_{Ti2O3}/I_{Al2O3}$ | Rz of $Al_2O_3$ layer in the substrate side (μm) | number of convex portions (numbers) | Exposed layer in cutting edge |
|---|---|---|---|---|---|---|---|---|---|---|
| 17 | TiN1 (0.2) | TiCN1 (2.2) | TiCN2 (0.3) | TiCNO1 (0.35) | α-$Al_2O_3$ TiN2 (1.0→0.5) | Scattering | 0.2 | 0.3 | 6 | TiN |
| 18 | TiN1 (0.4) | TiCN1 (2.0) | TiCN2 (0.5) | TiCNO2 (0.45) | α-$Al_2O_3$ TiN2 (1.0→0.5) | — | 0.25 | 0.35 | 7 | TiN/$Al_2O_3$ |
| 19 | TiN1 (0.1) | TiCN1 (3.5) | TiCN2 (0.5) | TiCO1 (0.1) | α-$Al_2O_3$ TiN2 (1.2→0.6) | Scattering | 0.22 | 0.25 | 13 | TiN |
| 20 | TiN1 (1.0) | TiCN1 (1.5) | TiCN2 (0.2) | TiCO2 (0.4) | α-$Al_2O_3$ TiN2 (1.5) | — | 0.4 | 0.2 | 10 | TiN |
| 21 | TiN1 (0.5) | TiCN1 (3.5) | TiCN2 (0.2) | TiCO3 (0.2) | α-$Al_2O_3$ TiN2 (1.5→0.8) | Scattering | 0.35 | 0.4 | 9 | TiN |
| 22 | TiN1 (0.7) | TiCN1 (2.5) | — | TiNO1 (0.4) | α-$Al_2O_3$ TiN2 (1.5→0.9) | Scattering | 0.2 | 0.5 | 5 | TiN |
| 23 | TiN1 (0.1) | TiCN1 (2.2) | TiCN2 (1) | TiCNO3 (0.2) | α-$Al_2O_3$ TiN2 (1.5→0.2) | — | 0.23 | 0.35 | 4 | $Al_2O_3$ |
| 24 | TiN1 (0.2) | TiCN1 (4.0) | — | TiCNO4 (0.35) | α-$Al_2O_3$ TiN2 (1.5→0.4) | — | 0.31 | 0.4 | 15 | $Al_2O_3$ |
| 25 | TiN1 (1.0) | TiCN1 (2.0) | TiCN2 (0.3) | TiCNO5 (0.25) | α-$Al_2O_3$ TiN2 (1.5→0.2) | — | — | 0.2 | 4 | $Al_2O_3$ |
| 26 | TiN1 (0.5) | TiCN1 (2.5) | TiCN2 (0.3) | TiCO4 (0.2) | α-$Al_2O_3$ TiN2 (1.5→0.7) | Scattering | — | 0.65 | 5 | TiN |
| 27 | TiN1 (0.3) | TiCN1 (2.6) | TiCN2 (0.4) | TiCO5 (0.3) | α-$Al_2O_3$ TiN2 (1.5→0.8) | — | 0.05 | 0.3 | 7 | TiN |
| 28 | TiN1 (0.6) | TiCN1 (2.3) | TiCN2 (0.3) | TiNO2 (0.35) | α-$Al_2O_3$ TiN2 (1.5→0.9) | Scattering | 0.21 | 0.1 | 2 | TiN |
| 29 | TiN1 (0.5) | TiCN1 (2.3) | TiCN2 (0.2) | TiCO6 (1.0)0.5 | α-$Al_2O_3$ TiN2 (1.5→0.5) | — | 0.18 | 0.2 | 6 | TiN/$Al_2O_3$ |
| 30 | TiN1 (0.3) | TiCN1 (3) | | — | κ-$Al_2O_3$ TiN2 (1→0.6) | — | — | — | — | TiN/$Al_2O_3$ |
| 31 | TiN1 (0.5) | TiCN1 (2.3) | TiCN2 (0.2) | TiC06 | α-$Al_2O_3$ 0.3 TiN2 (1.5→0.5) | — | — | 0.2 | 6 | TiCN |
| 32 | TiN1 (0.3) | TiCN1 (3) | — | — | TiN2 (1→0.6) | — | — | — | — | TiN |

[3)] ( ) stands for film thickness. Unit: μm
[4)] As for numbers in ( ) of the outermost surface layer column, the number on the left stands for film thickness right after deposition, and the number on the right stands for layer thickness of the breaker portion after grinding.

Under the following conditions, a continuous cutting test and an interrupted cutting test using this cutting tool were conducted to evaluate wear resistance and fracture resistance.
<Continuous Cutting Conditions>
Work material: stainless steel (SUS304)
Tool shape: CNMG120408
Cutting speed: 120 m/min
Feed rate: 0.2 mm/rev
Depth of cut: 1.5 mm
Cutting time: 30 min
Others: Use of water-soluble cutting fluid
Evaluation items: Through a microscope, the cutting edge was observed to measure flank wear amount and boundary wear amount
<Intermittent Cutting Conditions>
Work material: stainless steel with four grooves (SUS304)
Tool shape: CNMG120408
Cutting speed: 170 m/min
Feed rate: 0.2 mm/rev
Depth of cut: 1.0 mm
Others: Use of water-soluble cutting fluid
Evaluation item: The number of shocks leading to a fracture The peeling state of the coating layer of the cutting edge was observed through the microscope when the number of shocks reached 1000.

TABLE 6

| Sample No. | Wear test: Wear amount (mm) | | Fracture resistance test Number of shocks | |
|---|---|---|---|---|
| | Flank wear | Boundary wear | leading to a fracture (number of times) | cutting edge condition |
| 17 | 0.14 | 0.25 | 4600 | No damage |
| 18 | 0.16 | 0.27 | 4300 | No damage |
| 19 | 0.15 | 0.23 | 3800 | No damage |
| 20 | 0.15 | 0.27 | 3600 | No damage |
| 21 | 0.16 | 0.22 | 4500 | No damage |
| 22 | 0.17 | 0.26 | 4400 | No damage |
| 23 | 0.17 | 0.25 | 3900 | No damage |
| 24 | 0.15 | 0.25 | 3700 | No damage |
| 25 | 0.20 | 0.29 | 3300 | Chipping and film peeling |
| 26 | 0.22 | 0.21 | 3200 | Chipping |
| 27 | 0.19 | 0.20 | 2900 | Film peeling |
| 28 | 0.22 | 0.33 | 3100 | Chipping and film peeling |
| 29 | 0.32 | 0.43 | 2200 | Chipping and film peeling |
| 30 | 0.30 | 0.43 | 2300 | Chipping |
| 31 | 0.31 | 0.45 | 2000 | Chipping |
| 32 | 0.34 | 0.42 | 2100 | Chipping |

It will be noted from Tables 4 to 6 that in Sample No. 29, in which the layer thickness of the ($Al_2O_3$) layer exceeded 0.45 µm, wear advanced fast and a fracture occurred at an early stage. Similarly, in Sample No. 30, in which κ-$Al_2O_3$ was used as the aluminum oxide ($Al_2O_3$), wear advanced fast and a fracture occurred at an early stage.

On the other hand, Sample Nos. 17 to 28 having the layer configuration in accordance with the invention had a long lifetime both in the continuous cutting and the interrupted cutting. These samples had cutting performance having excellent fracture resistance and wear resistance.

INDUSTRIAL APPLICABILITY

In one embodiment of the invention, the particles composed mainly of cobalt are incorporated into the aluminum oxide layer. Thus, both high hardness and high toughness are attainable owing to the coexistence of the cobalt (Co) particles having excellent ductility, and the aluminum oxide ($Al_2O_3$) particles having excellent hardness in the aluminum oxide ($Al_2O_3$) layer. This enables suppression of the occurrence of cracks in the aluminum oxide ($Al_2O_3$) layer when a large interruption is generated during heavy interrupted cutting.

When the surface layer is deposited on the aluminum oxide ($Al_2O_3$) layer, even if cracks occur in the surface layer, the aluminum oxide ($Al_2O_3$) layer incorporating the cobalt particles having high toughness can suppress the crack propagation.

In the present invention, the coating layer preferably has the entire average layer thickness of 1.5 to 7.0 µm by sequentially stacking (a) the titanium nitride (TiN) layer 10 having an average layer thickness of 0.1 to 1.0 µm to be deposited on the surface of the substrate 2; (b) the titanium carbonitride (TiCN) layer 11 of columnar crystal structure having an average layer thickness of 1.0 to 4.0 µm; (c) the intermediate layer 12 constructed from at least one selected from the group consisting of titanium oxycarbide (TiCO), titanium oxynitride (TiNO), titanium carboxynitride (TiCNO) and titanium oxide ($Ti_2O_3$, $TiO_2$); having an average layer thickness of 0.05 to 0.4 µm (d) the aluminum oxide ($Al_2O_3$) layer 14 of an α-type crystal structure having an average layer thickness of 0.1 to 0.45 µm; and (e) the surface layer 15 having an average layer thickness of 0.1 to 2.0 µm which is composed of at least one selected from the group consisting of titanium nitride (TiN), zirconium nitride (ZrN) and hafnium nitride (HfN). In the cutting tool, the coating layer 8 at the cutting edge 6 is preferably brought into the state that the surface layer 15 is ground to reduce its thickness, or the surface layer 15 is removed to expose the aluminum oxide ($Al_2O_3$) layer 14.

This imparts excellent build-up resistance and wear resistance to the $Al_2O_3$ layer 14 exposed at the cutting edge. Additionally, even in the cutting process requiring fracture resistance, the chipping of the coating layer 8 can be suppressed while ensuring the wear resistance to avoid any practical problems.

In the present invention, the cobalt (Co) particles incorporated into the aluminum oxide ($Al_2O_3$) layer 14 preferably have an average particle size of 0.05 to 0.4 µm.

This enables the cutting tool to have a good balance between the toughness of metal and the wear resistance of ceramics. The aluminum oxide ($Al_2O_3$) layer has high toughness, that is, accomplishes the function of cushion. This enables suppression of the occurrence of cracks. Thus, the above-mentioned range is suitable for improving the adhesive strength of the hard layer without lowering wear resistance.

The cobalt (Co) particles incorporated into the aluminum oxide ($Al_2O_3$) layer are preferably composed of 92 to 98 wt % of cobalt, 1 to 4 wt % of titanium and the remainder as other materials, totaling 100 wt %.

In the above-mentioned range, both excellent wear resistance and toughness are attainable owing to a good balance between titanium (Ti) superior to cobalt (Co) in terms of ductility and cobalt (Co) superior to titanium in terms of elastic modulus.

Figure 1:
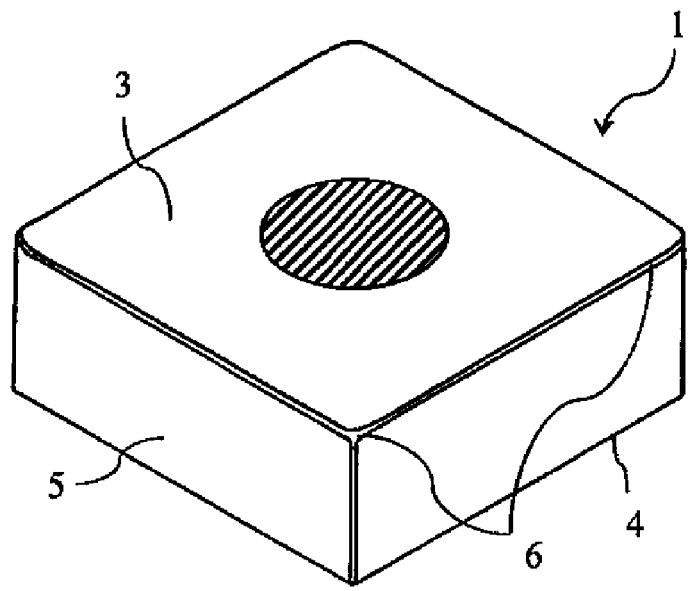
FIGS. 1(*a*) and 1(*b*) are a schematic perspective view and an enlarged sectional view of a key part in an example of a cutting tool (a cutting insert) of the invention, respectively.
Figure 1:
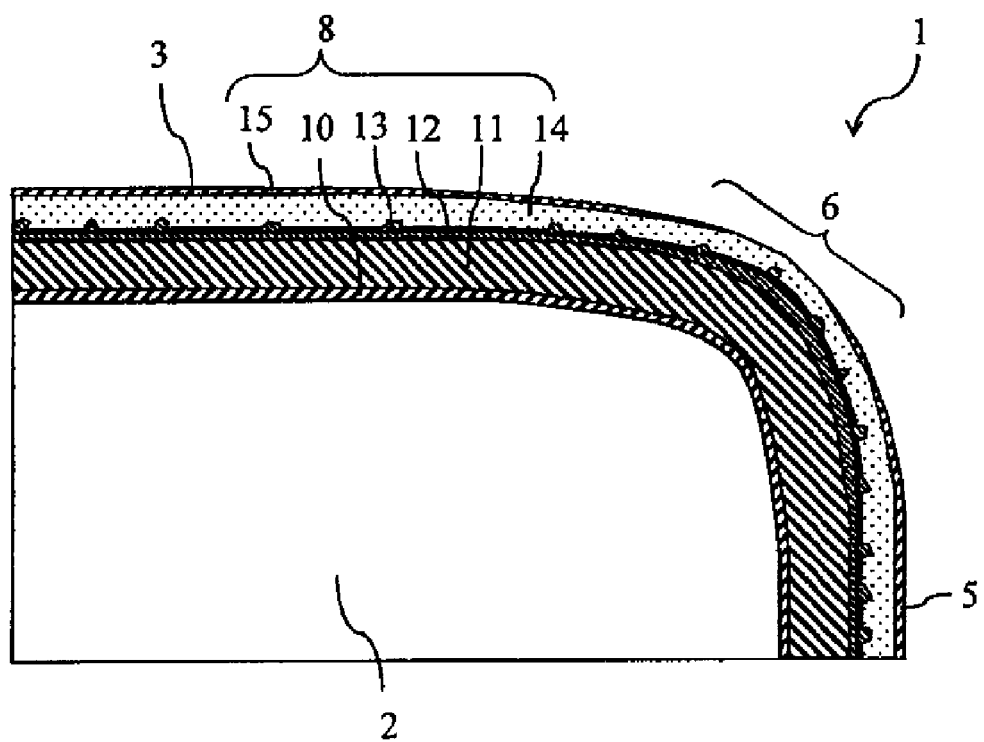
Figure 2:
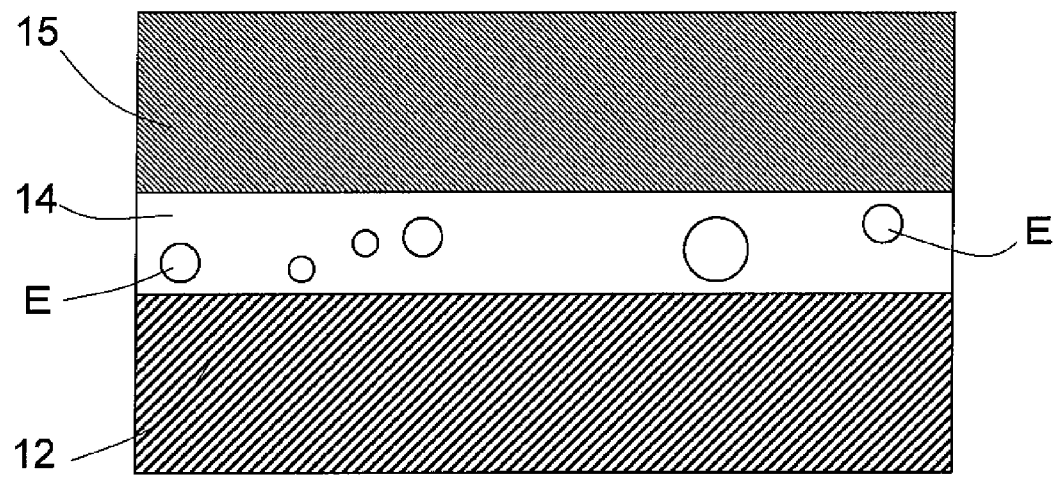
FIG. 2 is a sectional view showing cobalt particles within an aluminum oxide layer of the invention.
Figure 3:
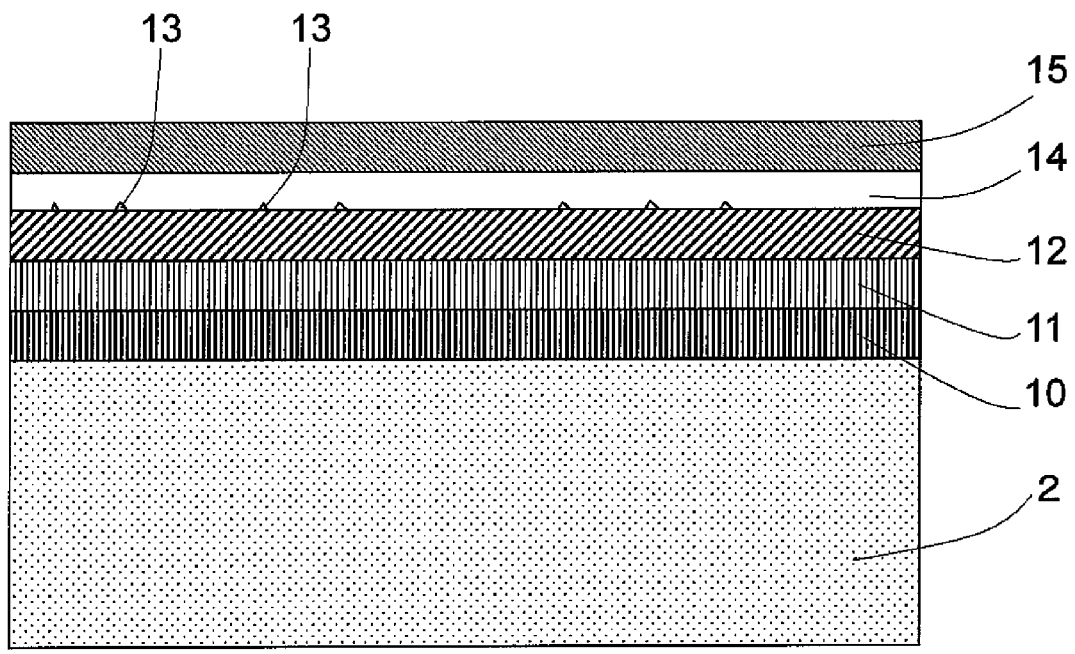
FIG. 3 is a cross-sectional view when the structure of other example (Example 2) of the cutting tool (the cutting insert) of the invention is observed.
Figure 4:
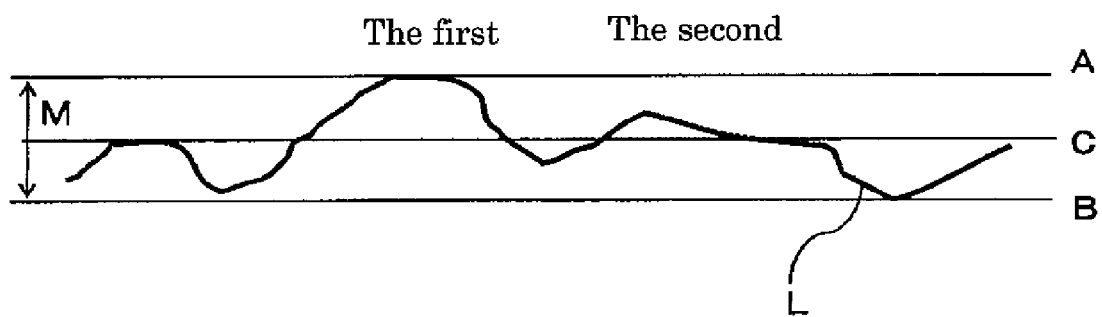
FIG. 4 is a schematic diagram explaining a method of measuring the number of convex portions at the interface of the aluminum oxide layer adjacent to the substrate.
Figure 5:
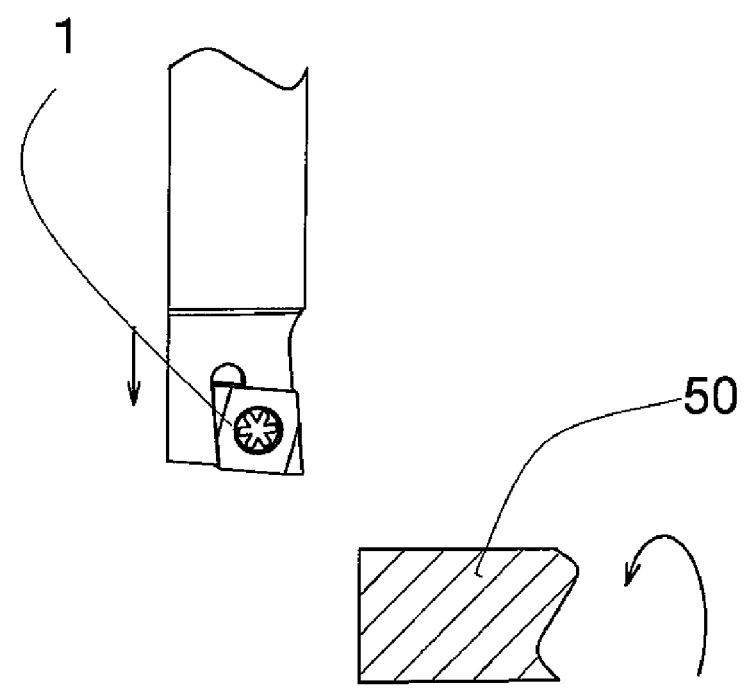
FIG. 5 to 7 are process drawings of a cutting method according to the invention.
Figure 6:
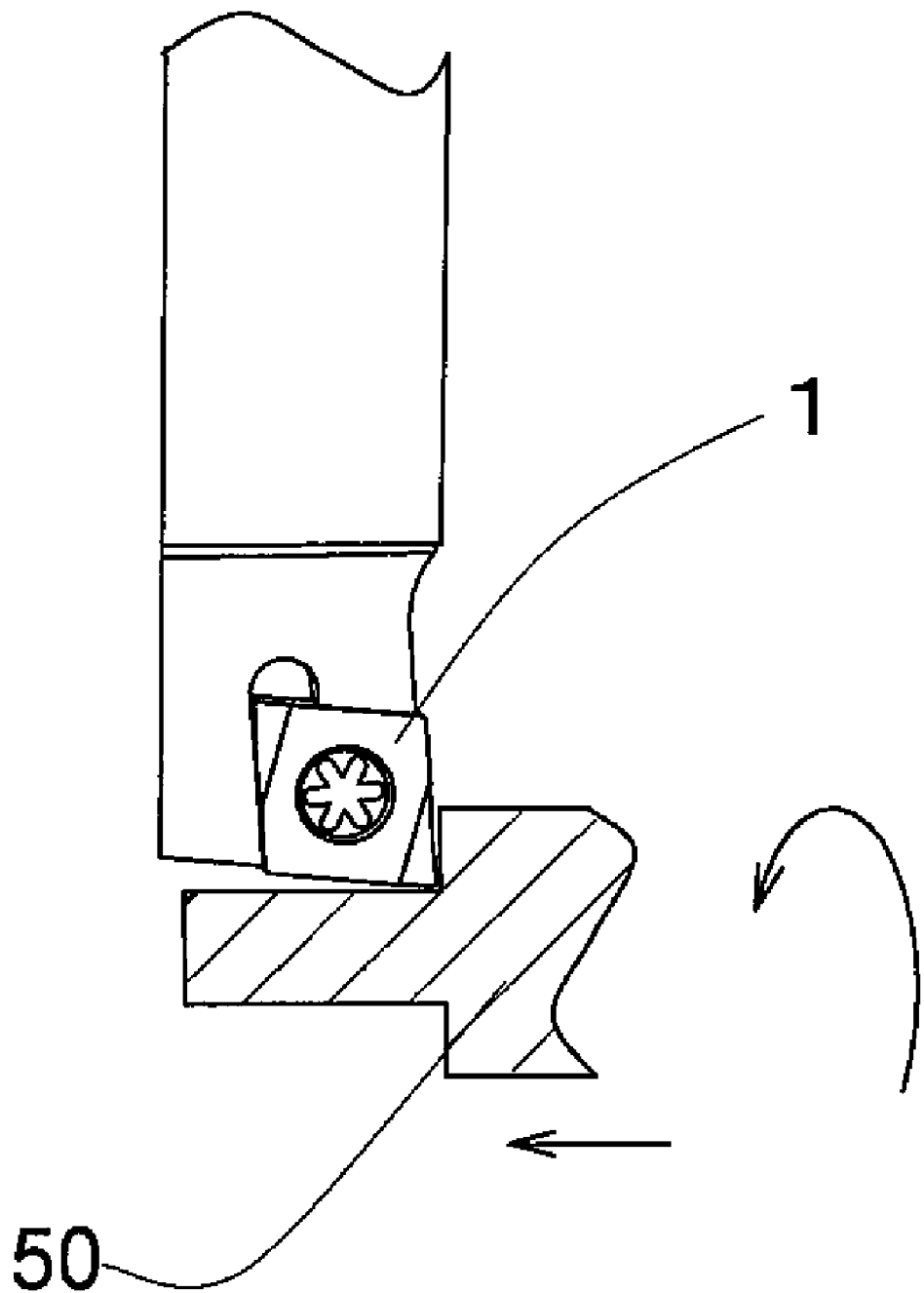
Figure 7:
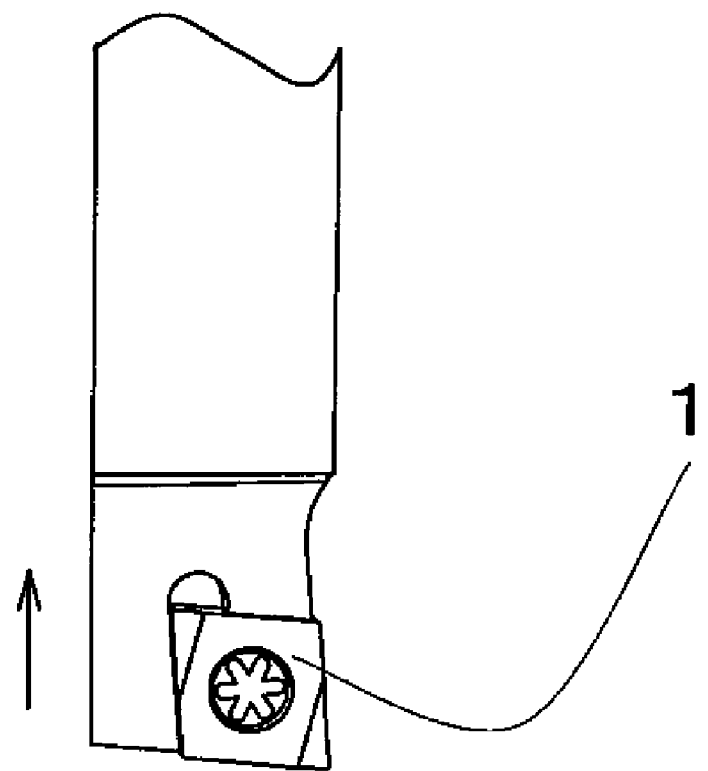
Figure 7:
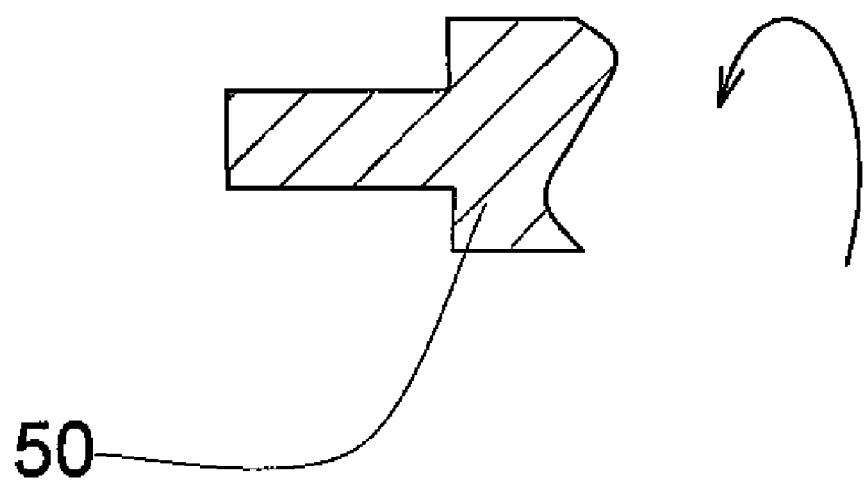

The invention claimed is:

1. A cutting tool having a substrate and a coating layer formed on a surface of the substrate, wherein
the substrate contains at least cobalt,
the coating layer includes at least a titanium nitride layer formed on the surface of the substrate, a titanium carbonitride layer formed on the surface of the titanium nitride layer, an intermediate layer formed on the surface of the titanium carbonitride layer and an aluminum oxide layer formed on the surface of the intermediate layer,
the intermediate layer contains at least oxygen and titanium, and
the aluminum oxide layer incorporates particles composed mainly of cobalt.

2. The cutting tool according to claim 1, wherein in the coating layer,
the titanium nitride layer has an average layer thickness of 0.1 to 1 μm,
the titanium carbonitride layer has an average layer thickness of 1.0 to 6 μm,
the intermediate layer has an average layer thickness of 0.05 to 0.4 μm, and
the aluminum oxide layer has an average layer thickness of 0.1 to 0.45 μm.

3. The cutting tool according to claim 1, wherein
a plurality of the particles composed mainly of cobalt exist in the aluminum oxide layer, and
the particles composed mainly of cobalt have an average particle size of 0.05 to 0.4 μm.

4. The cutting tool according claim 1, wherein
the number of cobalt particles in the aluminum oxide layer included in a reference length 10 μm parallel to the interface between the intermediate layer and the aluminum oxide layer is 3 to 20.

5. The cutting tool according to claim 1, wherein the cobalt particles incorporated into the aluminum oxide layer are composed of 92 to 98 wt % of cobalt, 1 to 4 wt % of titanium and the remainder as unavoidable impurities, totaling 100 wt %.

6. The cutting tool according claim 1, wherein the aluminum oxide layer has an α-type crystal structure.

7. The cutting tool according to claim 1, wherein
a surface layer is formed on the aluminum oxide layer,
the surface layer is composed of at least one selected from the group consisting of titanium nitride, titanium carbide, titanium carbonitride, zirconium nitride and hafnium nitride, and
the surface layer has an average layer thickness of 0.1 to 2 μm.

8. The cutting tool according to claim 2, wherein the entire coating layer has an average layer thickness of 1.5 to 7 μm.

9. The cutting tool according to claim 1, wherein the substrate is composed mainly of tungsten carbide.

10. The cutting tool according to claim 1, wherein
the substrate has a flat plate shape, whose main surface is used ac a rake face and a side surface is a flank, and a cutting edge is formed at a crossed ridge portion between the rake face and the flank,
in the coating layer at the cutting edge, a surface layer is formed on the surface of the aluminum oxide layer, and at least the surface layer is ground and mirror polished to reduce its thickness, or the surface layer is removed to expose the aluminum oxide layer.

11. A cutting method of cutting a work material by using the cutting tool according to claim 10, comprising:
the approach step of causing the cutting edge of the cutting tool and the work material to approach each other;
the cutting step of cutting the surface of the work material by rotating at least one of the cutting tool and the work material and bringing the cutting edge into contact with the work material; and
the move-away step of causing the work material and the cutting edge to move away from each other.

12. A method of manufacturing a cutting tool, wherein
the cutting tool has a substrate and a coating layer deposited on a surface of the substrate, and
the coating layer includes at least a titanium nitride layer deposited on the surface of the substrate, a titanium carbonitride layer deposited on the surface of the titanium nitride layer, an intermediate layer deposited on the surface of the titanium carbonitride layer and an aluminum oxide layer deposited on the surface of the intermediate layer,
the method comprising:
the preprocessing step of retaining the substrate in a CVD furnace by introducing a mixed gas prepared by mixing $H_2$ in the range of 50 to 75 vol % and $N_2$ in the range of 25 to 50 vol %, totaling 100 vol %, while performing control so that a Vg/Vr (L/min) is 0.1 to 0.3 (L/min), where Vg (L.min) is the volume (flow rate) of the introduced gas at room temperature and atmospheric pressure, and Vr (L) is the volume of the inside of the CVD furnace;
the titanium nitride layer forming step of depositing a titanium nitride layer on a surface of the substrate;
the mid-processing step of retaining the substrate provided with the titanium nitride layer in the CVD furnace by introducing into the CVD furnace a mixed gas prepared by mixing $H_2$ in the range of 50 to 75 vol % and $N_2$ in the range of 25 to 50 vol %, totaling 100 vol %, while performing control so that the Vg/Vr (L/min) is 0.1 to 0.3 (L/min);
the titanium carbonitride layer/intermediate layer forming step of sequentially depositing a titanium carbonitride layer and an intermediate layer on the titanium nitride layer;
the post-processing step of retaining the substrate provided with the intermediate layer by introducing a mixed gas prepared by mixing $AlCl_3$ in the range of 1 to 15 vol % and $H_2$ in the range of 85 to 99 vol %, totaling 100 vol %; and
the aluminum oxide layer forming step of depositing an aluminum oxide layer on the intermediate layer.

13. The method of manufacturing a cutting tool according to claim 12, wherein the preprocessing step has a processing time of 10 to 60 minutes.

14. The method of manufacturing a cutting tool according to claim 12, wherein the mid-processing step has a processing time of 10 to 60 minutes.

15. The method of manufacturing a cutting tool according to claim 12, wherein the post-processing step has a processing time of 15 to 60 minutes.

* * * * *